(12) United States Patent
Hoffmann et al.

(10) Patent No.: US 8,323,734 B2
(45) Date of Patent: Dec. 4, 2012

(54) METHOD FOR THE APPLICATION OF A FILTER ON A WEB

(75) Inventors: Gerd Hoffmann, Bruchköbel (DE); Rainer Ludwig, Hösbach (DE); Hans-Georg Lotz, Gründau-Rothenbergen (DE); Gerhard Steiniger, Offenbach (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 158 days.

(21) Appl. No.: 12/964,311

(22) Filed: Dec. 9, 2010

(65) Prior Publication Data

US 2011/0081485 A1    Apr. 7, 2011

Related U.S. Application Data

(62) Division of application No. 10/591,156, filed as application No. PCT/DE2004/000392 on Mar. 1, 2004, now abandoned.

(51) Int. Cl.
*C23C 16/00* (2006.01)
*B05B 5/14* (2006.01)
*H01F 1/00* (2006.01)
*B05D 3/12* (2006.01)
*G02B 1/10* (2006.01)

(52) U.S. Cl. ............... 427/248.1; 427/250; 427/251; 427/255.23; 427/255.24; 427/255.5; 427/255.7; 427/482; 427/549; 427/172; 118/718; 359/588

(58) Field of Classification Search .................. None
See application file for complete search history.

(56) References Cited

U.S. PATENT DOCUMENTS

| | | | |
|---|---|---|---|
| 2,590,906 A | 4/1952 | Tripp | |
| 3,011,383 A | 12/1961 | Sylvester et al. | |
| 4,526,132 A * | 7/1985 | Ohta | ............. 118/719 |
| 5,182,670 A | 1/1993 | Khan et al. | |
| 5,363,398 A | 11/1994 | Glass et al. | |
| 6,034,813 A | 3/2000 | Woodard et al. | |
| 6,040,642 A | 3/2000 | Ishiyama | |
| 6,165,598 A | 12/2000 | Nelson | |
| 6,200,431 B1 | 3/2001 | Sone | |
| 6,234,166 B1 | 5/2001 | Katsir et al. | |
| 6,451,184 B1 | 9/2002 | Sone | |
| 6,777,085 B1 | 8/2004 | Argoitia et al. | |
| 2002/0197459 A1 | 12/2002 | Huhn et al. | |
| 2005/0249875 A1 * | 11/2005 | Sasaki et al. | ............ 427/248.1 |

FOREIGN PATENT DOCUMENTS

| | | |
|---|---|---|
| DE | 198 45 268 | 1/2000 |
| DE | 198 34 734 | 2/2000 |
| EP | 0 860 513 | 8/1998 |
| EP | 0 878 899 | 11/1998 |
| RU | 2 054 639 C1 | 2/1996 |

* cited by examiner

*Primary Examiner* — Timothy Meeks
*Assistant Examiner* — Mandy Louie
(74) *Attorney, Agent, or Firm* — Fulbright & Jaworski L.L.P.

(57) ABSTRACT

A Fabry-Perot filter is applied as a thin coating on a film, for example, a packaging film, and permits interesting color effects. The coating has a layered construction in which both reflecting layers of the filter may be made of aluminum and the intermediate layer between the reflecting layers may be made of aluminum oxide.

2 Claims, 2 Drawing Sheets

METHOD FOR THE APPLICATION OF A FILTER ON A WEB

Figure 1:
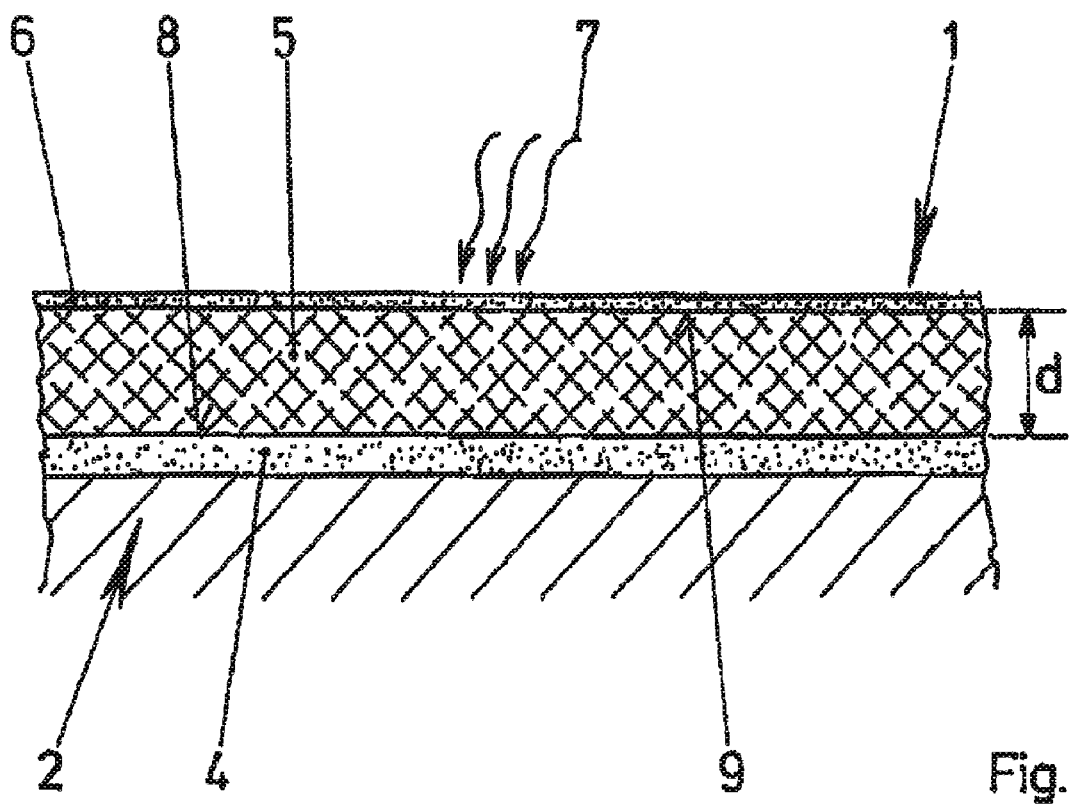

This application is a divisional of application Ser. No. 10/591,156 filed Feb. 12, 2007, now abandoned which is a §371 of PCT/DE2004/000392 filed Mar. 1, 2004, both incorporated by reference in their entities.

The invention relates to a substrate with a Fabry-Perot filter comprised of at least three layers applied thereon, a first and a second reflecting layer of the filter with their mutually facing reflecting surfaces spaced apart from one another by a gap of thickness d and enclosing a light-transmitting intermediate layer disposed in the gap.

Fabry-Perot filters, also referred to as Fabry-Perot layers, of this type are, for example, vapor-deposited onto decorative web sheeting. According to EP 0 878 899 the layer system of the filter is comprised of a metallically reflecting base layer onto which a transparent intermediate SiO layer having a layer thickness between 50 and 2000 nm is applied. The completing layer of the system is formed by a partially light-transmitting reflecting layer of a metal having a thickness between 0.2 and 60 nm. While it is possible to realize interesting color compositions with such layers, with the currently employed techniques they can however only be realized with high production expenditures.

For conventional vacuum coating facilities are solely capable of applying only one layer of a specific material in each pass of the substrate. If a coating consists of several layers, several passes are necessary, as a consequence of which the facility must be newly charged and evacuated for each pass. The time and the corresponding personnel costs required for this purpose reduce productivity and increase production costs.

While it would be conceivable to situate in one vacuum coating facility several coating stations in which the substrate is successively provided with different layers, this approach, however, is not acceptable since it entails considerable additional investment costs.

The invention consequently addresses the problem of producing a Fabry-Perot filter as the coating of a substrate showing similar color effects as the coatings known up to now, the filter being such that it can be realized with conventional production facilities.

The invention furthermore is based upon the problem of demonstrating a method with which such a coating can be applied onto the substrate in a facility with only one vaporization station.

The former problem is solved thereby that the reflecting layers are comprised of the same base material and the intermediate layer is comprised of a chemical compound of this base material with a further material.

As investigations with aluminum as the base material and oxygen as the further material have demonstrated, such a layer structure yields filters which bring about similar color effects as the Fabry-Perot layers according to the above cited prior art. However, they can be applied onto a substrate substantially more simply and with simpler means. The vaporization unit of a coating facility only needs to be charged with one base material, through the vaporization of which the two reflection layers are formed. To form the intermediate layer the further material is supplied to the base material such that it can be deposited with the base material on the first reflecting layer.

The base material conventionally involves a metal and the further material oxygen which, via appropriate inlet lines, can be conducted into the evacuated vaporization chamber. The systems and procedures required for this purpose are known.

By supplying oxygen a so-called reactive coating is developed, since the oxygen to some extent combines chemically with the metal atoms or metal ions or molecules in the metal vaporization cloud and, to some extent, is deposited with it on the substrate and only here forms a compound with the metal. However, the reactions do not run to completion, such that coatings are intentionally developed, which do not absolutely exhibit a stoichiometric distribution of the participating reaction partners.

Aluminum can be processed especially simply as the base material, such that the intermediate layer is comprised of an aluminum oxide with the structural formula $Al_2O_3$.

Instead of oxygen, nitrogen can also be utilized such that as the intermediate layer a metal-nitrogen compound, or, for example, aluminum nitride, is formed, if the metal is aluminum.

In some cases, for example in particular if the substrate involves web sheeting, for example packaging sheets, the filter material should overall not be transmissible to light. This is attained thereby that the first reflecting layer adjoining the substrate is opaque to light and the outer, second reflecting layer is partially transmissible to light. This is attained through the appropriate thickness of the particular layers. Values to be considered for this purpose are between 50 and 200 nm for the first reflecting layer and for the second reflecting layer between 1 to 20 nm, the intermediate layer having a thickness between 50 to 2000 nm depending on the desired property of the filter.

For the solution of the second problem the invention provides a method for the application of a filter comprising the following steps:

providing a vacuum coating facility with a vaporization device in an evacuatable vacuum chamber and a material supply device, charging the vaporization device with the base material, closing the vacuum chamber and generating a vacuum therein, vaporizing the base material exclusively, such that it is deposited as a first layer on the substrate, vaporizing the base material with the simultaneous introduction of the further material into the vacuum chamber, such that the substrate provided with the first layer is reactively vapor-deposited with an intermediate layer of the base material and the further material, vaporizing the base material exclusively, such that it is deposited on the intermediate layer to form a second reflecting layer, opening the coating chamber and removing the substrate provided with the filter.

As is evident on the basis of the method steps, a vacuum coating facility with only a single vaporization device is capable of carrying out the coating in one evacuation cycle. The facility only needs to be evacuated once. Only after the Fabry-Perot filter comprised of three layers has been completely structured, is the coating facility opened again and the coated substrate removed.

Since, as explained above, as the further material a gas, in particular oxygen, is supplied, the material supply device is comprised of a gas connection with an injection tube with which the gas is conducted into the proximity of the vaporization cloud.

For the coating of web sheeting the coating facility includes a cooled coating cylinder on which the web is unwound and in the process is coated by the vaporization device disposed beneath the vaporization coating cylinder. The vacuum chamber furthermore includes two stock rolls, the web initially being wound from the first stock roll and wound onto the second stock roll. The two rolls exchange their function for the application of the intermediate layer. The roll wound up in the first pass is unwound again, such that the first roll is filled again. In a third pass the second reflection layer is applied, with the web being wound from the first roll again and wound onto the second roll.

As is evident on the basis of the explanations, known simple coating facilities therefore do not need to be significantly modified. It is only necessary to ensure that additionally provided guide rollers for the supply of the web to the stock rolls are so disposed and utilized that the web can pass through the system in the one as well as also in the other direction.

Figure 2:
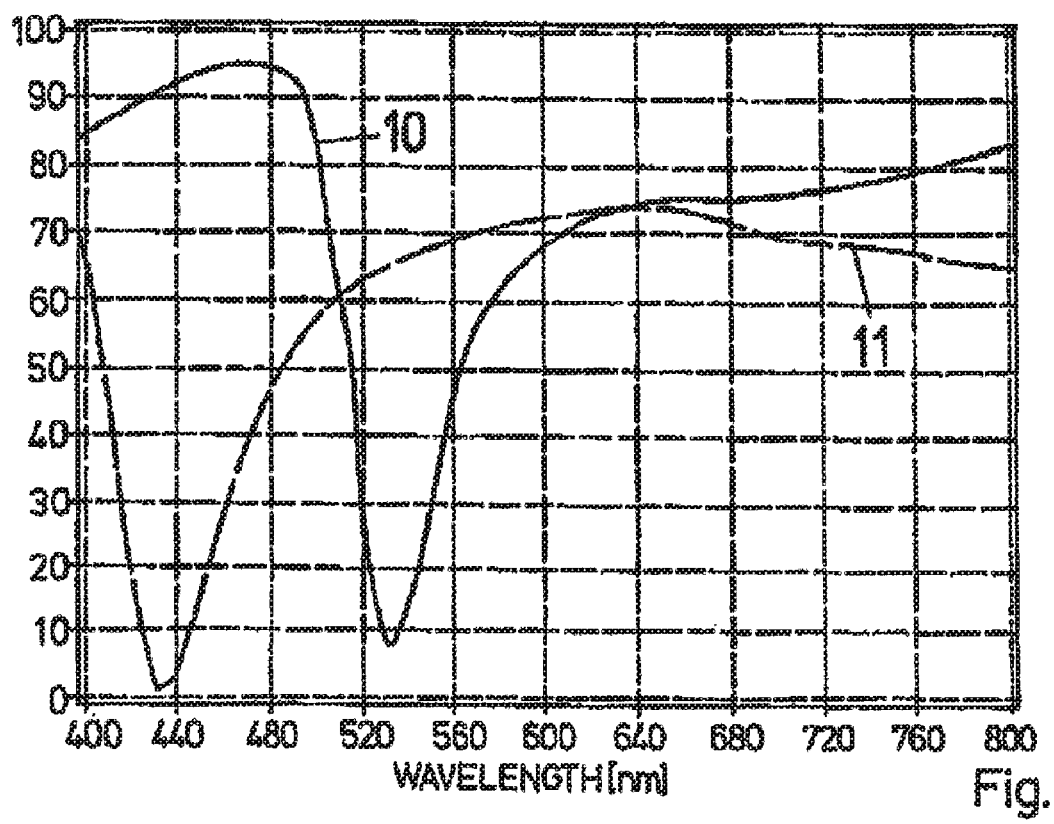
Figure 3:
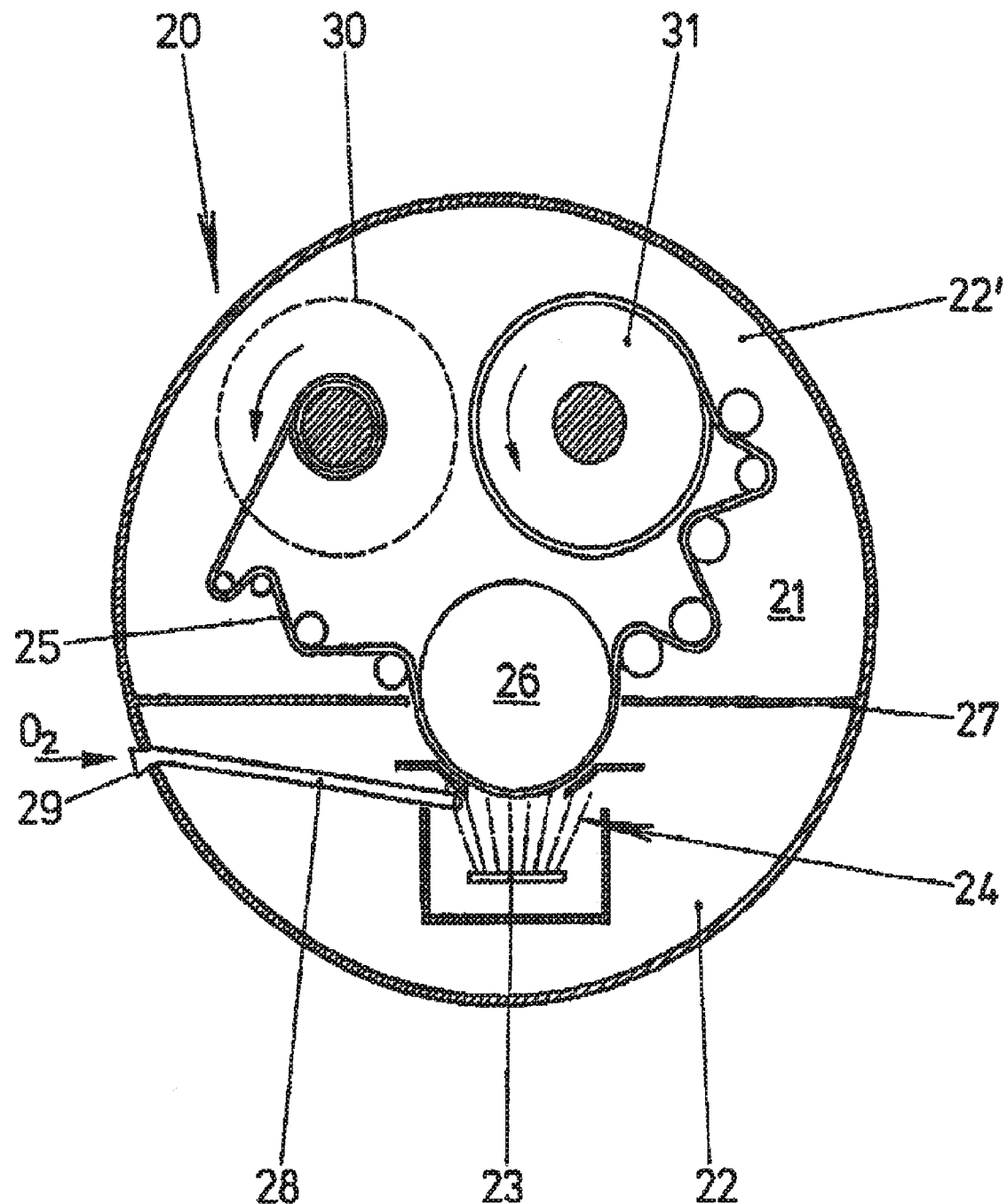

In the following the invention will therefore be explained in further detail in conjunction with an embodiment example. In the drawing depict:

FIG. 1 a typical structure of a Fabry-Perot filter on a substrate,

FIG. 2 a diagram with the reflection properties of the filter relating to different wavelengths and also as a function of the thickness d of the intermediate layer, FIG. 3 a schematic representation of a vacuum coating facility.

Reference is first made to FIG. 1. It depicts in cross section a Fabry-Perot filter 1 on a substrate 2. The filter 1 is comprised of three layers, namely a first reflection layer 4 of aluminum, an intermediate layer 5 applied thereon of thickness d comprised of aluminum oxide $Al_2O_3$, as well as a second reflection layer 6 applied thereon also comprised of aluminum. As is evident, the first reflection layer 4 is markedly thicker than the second reflection layer 6. The first reflection layer 4 is therefore opaque to light while the second outer layer 6 is partially transmissible to light.

Light 7 penetrating into the filter 1 is thrown back and forth between the reflecting faces 8, 9 of the reflecting layers 4, 6, and the light with a wavelength corresponding to the thickness d of the intermediate layer 5 is partially absorbed through interference. Thereby result the spectra 10, 11 represented in the diagram of FIG. 2.

On the X-axis of the diagram are marked the wavelengths between 400 and 800 nm and on the Y-axis the reflectance of the filter in percent. The two spectra 10, 11 are each based on a filter in which the first reflecting layer 4 has a thickness of 100 nm and the second reflecting layer 6 a thickness of 10 nm. For the one spectrum 10 (heavy curve) the thickness of the intermediate layer is 200 nm, such that wavelengths in the range of 530 nm are strongly absorbed, i.e. are not reflected. For a thickness of 62.5 nm of the intermediate layer the other spectrum 11 (thin curve) results which has a reflection minimum for wavelengths around 430 nm.

A layer according to the one spectrum 10 consequently has reduced reflection in the green range, such that a marked purple-colored reflection results. For the other spectrum 11 a yellowish-green color reflection results.

The coating is applied onto a web by means of a coating facility, as is depicted schematically in FIG. 3.

The facility 20 is comprised of a two-part vacuum chamber 21 with a lower and an upper vacuum chamber 22, 22', with a vaporization device 23 disposed in the lower chamber 22. This device may be, for example, a crucible containing the material to be vaporized, which is vaporized in the crucible by means of electron guns not further shown here. The vapor 24 impinges onto a web 25 unwound via a cooled coating cylinder 26 located in an opening in a partitioning wall 27 between the two vacuum chambers 22, 22'. In the lower vacuum chamber 22 is additionally located an injection tube 28 through which a gas, for example oxygen, can be conducted into the vaporization cloud 24 via an outer connection 29. In the upper second vacuum chamber 22' are located a first stock roll 30 and a second stock roll 31. In a first pass the first stock roll 30 is unwound and the web wound onto the second stock roll 31. In the process the material, for example aluminum, vaporizing in the crucible is applied onto the web. The layer thickness is therein primarily determined by the transport rate of the web. In a second pass the winding process is reversed. Web 25 is wound from the second stock roll 31 and transferred back again onto the first stock roll 30. During this second pass oxygen is introduced via the injection tube 28 into the vaporization cloud 24. Onto the vaporization cloud 24 a microwave field can additionally be superimposed. The oxygen combines with the vaporized metal atoms and together with them is deposited on the first reflection layer 4 as the intermediate layer 5. The chemical combination to form aluminum oxide occurs to some extent only after both materials have been deposited as a layer. This process is also denoted as reactive coating.

In a third pass the transport direction of the stock roll 30, 31 is reversed again and the second reflecting layer is applied through the exclusive vaporization of the metal.

LIST OF REFERENCE NUMBERS

1 Fabry-Perot filter
2 Substrate
3
4 First reflection layer
5 Intermediate layer
6 Second reflection layer
7 Light
8,9 Faces
10,11 Spectra
12
13
14
15
16
17
18
19
20 Facility
21 Vacuum chamber
22 Lower chamber
22' Upper chamber
23 Vaporization device
24 Vaporization cloud
25 Web sheeting
26 Coating cylinder
27 Partitioning wall
28 Injection tube
29 Outer connection
30 First stock roll
31 Second stock roll

The invention claimed is:

1. A method for applying an optical filter on a web, comprising the following steps:
   providing a vacuum coating facility comprising both a vaporization device and a material supply device in a vacuum chamber, where the vacuum chamber includes a first stock roll and a second stock roll,
   providing a web wound on the first stock roll,
   charging the vaporization device with a metal, and then closing the vacuum chamber and generating a vacuum therein, vaporizing the metal exclusively in a first pass provided in a first transport direction, where the web is being unwound from said first stock roll and wound onto the second stock roll, such that the metal is deposited onto the web as a first layer, reversing the first transport direction to a second transport direction by unwinding the web from the second stock roll and winding the web onto the first stock roll, vaporizing the metal with simultaneous introduction of a further material into the vacuum chamber via the material supply device in a second pass provided in the second transport direction, such that the web provided with the first layer thereon is reactively vapor-deposited with an intermediate layer of the metal and the further material, reversing the second transport direction back to the first transport direction by unwinding the web from the first stock roll and winding the web onto the second stock roll, vaporizing the metal exclusively in a third pass provided in the first transport direction, such that metal is deposited on the intermediate layer to form a reflecting layer, and then opening the coating chamber and removing the coated web.

2. The method as claimed in claim 1, wherein the material supply device is a gas connection.

* * * * *